(12) United States Patent
Hatanaka et al.

(10) Patent No.: US 7,243,424 B2
(45) Date of Patent: Jul. 17, 2007

(54) PRODUCTION METHOD FOR A MULTILAYER CERAMIC SUBSTRATE

(75) Inventors: Kiyoshi Hatanaka, Tokyo (JP); Haruo Nishino, Tokyo (JP); Hideaki Ninomiya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/059,585

(22) Filed: Feb. 17, 2005

(65) Prior Publication Data

US 2005/0189137 A1 Sep. 1, 2005

(30) Foreign Application Priority Data

Feb. 27, 2004 (JP) ............... 2004-054271

(51) Int. Cl.
*H01K 3/10* (2006.01)
(52) U.S. Cl. .................. 29/852; 29/846; 29/850; 29/851; 156/8.11; 156/89.17; 156/252; 156/253; 174/256; 174/259; 257/741; 257/758
(58) Field of Classification Search ........... 29/852, 29/846, 850, 851; 156/8.11, 89.17, 252, 156/253; 174/256, 259; 257/741, 758
See application file for complete search history.

(56) References Cited

U.S. PATENT DOCUMENTS

| 5,661,882 | A | 9/1997 | Alexander |
| 6,488,795 | B1 * | 12/2002 | Sakai ............... 156/89.17 |
| 7,018,494 | B2 * | 3/2006 | Suzuki et al. ........ 156/89.11 |

FOREIGN PATENT DOCUMENTS

| JP | A 02-239697 | 9/1990 |
| JP | A 05-174649 | 7/1993 |
| JP | A 06-084675 | 3/1994 |
| JP | A 06-232285 | 8/1994 |
| JP | A 08-236931 | 9/1996 |
| JP | 11-087918 | 3/1999 |
| JP | 11-163530 | 6/1999 |
| JP | A 11-284334 | 10/1999 |
| JP | 2001-144438 | 5/2001 |
| JP | A 2004-063728 | 2/2004 |
| JP | 2004-087990 | * 3/2004 |
| JP | 2004-148610 | 5/2004 |

* cited by examiner

*Primary Examiner*—A. Dexter Tugbang
*Assistant Examiner*—Tim Phan
(74) *Attorney, Agent, or Firm*—Oblon, Spivak, McClelland, Maier & Neustadt, P.C.

(57) ABSTRACT

An object of the invention is to connect different dielectrics electrically to each other in the direction of main surface of a sheet in a multilayer ceramic substrate and to increase the degree of flexibility in design and make the multilayer ceramic substrate compact in size. A multilayer ceramic substrate in accordance with the invention is formed of a plurality of laminated ceramic substrates including such a composite ceramic substrate of different materials that is made by inserting the second ceramic substrate in a pounched-out portion made in the first ceramic substrate and by planarizing its top and bottom surfaces, wherein a conductive layer is formed in a portion across a boundary between the first ceramic substrate and the second ceramic substrate of the interface of the composite ceramic substrate of different materials.

9 Claims, 5 Drawing Sheets

PRODUCTION METHOD FOR A MULTILAYER CERAMIC SUBSTRATE

CROSS-REFERENCE TO RELATED APPLICATIONS

This application claims priority of the Japanese Patent Application No. 2004-054271 filed on Feb. 27, 2004.

BACKGROUND OF THE INVENTION

1. Field of the Invention

The invention relates to a multilayer ceramic substrate constructed of a combination of a plurality of ceramic materials having electric characteristics and/or physical characteristics that are different from each other and a its production method.

2. Description of the Related Art

A multilayer ceramic substrate is formed of a plurality of ceramic layers and conductive lines are formed along the interfaces between the respective ceramic layers. Usually, the multilayer ceramic substrate is manufactured by laminating green sheets of plural kinds of ceramic materials having electric characteristics and/or physical characteristics that are different from each other so as to achieve multiple functions and high performance and by firing the produced composite laminated body at the same time. This is because electronic elements required to have different dielectric characteristics such as capacitor and inductor are integrally formed in the multilayer ceramic substrate.

In order to produce such a multilayer ceramic substrate, the following means have been proposed in the related art.

(1) A method of laminating plural kinds of ceramic layers that contain ceramic materials providing different electric characteristics from each other, respectively. For example, a method of laminating plural kinds of ceramic layers that contain dielectric ceramic materials having different dielectric constants from each other, respectively, and ceramic layers that contain a magnetic ceramic material (for example, see Japanese Patent Application Laid-Open (JP-A) No. 2001-144438 (patent document 1)).

(2) A method of forming spaces in a not-yet-fired laminated body of green sheets, inserting not-yet-fired molded body blocks in the spaces, and then firing the molded body blocks and the laminated body of green sheets at the same time (for example, see JP-A No. 61-288498 (patent document 2), Japanese Patent No. 3322199 (patent document 3), JP-A No. 11-163530 (patent document 4), and JP-A No. 11-87918 (patent document 5)).

SUMMARY OF THE INVENTION

However, in the technology disclosed in patent document 1, dielectrics are arranged in layers in the substrate, so that the degree of flexibility in design is low. In addition, each layer needs to have a sufficient thickness so as to form an element suitable for a dielectric constant in the direction of main surface of each layer, so that the thickness of the whole multilayer ceramic substrate increases.

Further, in the technologies disclosed in patent documents 2 to 5, the respective parts can be connected to each other only in the direction of thickness of the substrate, so that the degree of flexibility in design is low. Also, it is difficult to put the molded body blocks into the spaces in the laminated body with high accuracy. Still further, gaps are apt to be produced between the parts to decrease reliability. In addition, the laminated body and the molded body blocks are different from each other 90 degrees in the direction of lamination, so that it is difficult to adjust the spatial size of the laminated body and the sizes of the molded body blocks and unnecessary spaces are required for the adjustment.

Therefore, an object of the invention is to provide a multilayer ceramic substrate characterized in that: (1) different dielectrics are electrically connected to each other in the direction of main surface of a sheet, whereby the degree of flexibility in design is increased and the substrate is made compact in size; (2) dielectrics are formed in required sizes in necessary portions as compared with the laminated structure disclosed in patent document 1, whereby limitations of material physical properties (firing shrinkage, coefficient of thermal expansion) of dielectrics to be combined can be relaxed; and (3) different dielectrics are inserted in desired portions with high accuracy. In addition, another object of the invention is to provide a method of manufacturing a multilayer ceramic substrate having the features described above.

The inventors earnestly studied a construction of connecting different dielectrics electrically in the direction of main surface of a sheet to increase the degree of flexibility in design. As a result, the inventors found that the above-described object could be achieved by forming a composite green sheet of different materials by inserting a green sheet in the predetermined portion of another green sheet formed of a material different from the material of the former green sheet, and by laminating and firing the composite green sheets of different materials. That is, a multilayer ceramic substrate according to the invention is formed of a plurality of laminated ceramic substrates including a composite ceramic substrate of different materials that is made by inserting the second ceramic substrate in a pounched-out portion made in the first ceramic substrate and by planarizing its top and bottom surfaces, and is characterized in that a conductive layer is formed in a portion across a boundary between the first ceramic substrate and the second ceramic substrate of the interface of the composite ceramic substrate of different materials. Electronic elements such as an inductor element, a capacitor element, an LC composite circuit element, and a filter circuit element can be integrally formed in arbitrary portions of the respective laminated ceramic substrates and conductive lines for connecting the electronic elements in the direction of main surface of the ceramic substrate can be arranged without limitation. Hence, this enhances the degree of flexibility in circuit design. Further, the electronic elements can be easily designed in necessary and sufficient sizes, which makes it possible to design a high-density circuit and hence can make the substrate compact in size.

The multilayer ceramic substrate according to the invention includes a case where the composite ceramic substrates of different materials are overlaid on each other above and below in the direction of lamination, and the second ceramic substrates are also overlaid on each other and have an internal conductive layer interposed therebetween. This internal conductive layer becomes a circuit pattern and internal electrodes of elements to be formed in the substrate.

The multilayer ceramic substrate according to the invention includes a case where any one or both of the first ceramic substrate and the second ceramic substrate has or have a via hole. The first ceramic substrate is a substrate to be a base and a via hole formed therein can secure conduction between the laminated substrates and can provide a three-dimensional circuit. Needless to say, a via hole can be formed also in the second substrate.

The multilayer ceramic substrate according to the invention includes a case where the first ceramic substrate and the second ceramic substrate are formed of materials of different dielectric constants. Because the electronic elements such as capacitor elements and inductor elements are arranged in the same ceramic substrate, the substrate can be made thinner as compared with a case where ceramic substrates of different dielectric constants are overlaid on each other in the direction of lamination to form these electronic elements.

It is preferable in the multilayer ceramic substrate according to the invention that the ceramic substrate is a low temperature co-fired ceramic (hereinafter referred to as LTCC substrate). The LTCC substrate can be easily made a multilayer substrate having electronic circuit elements or conductive lines formed therein, which can realize the higher packaging density and compact size of a device.

A method of manufacturing a multilayer ceramic substrate according to the invention is characterized by including the steps of: punching out a predetermined portion of the first green sheet; overlaying the second green sheet on the first green sheet and bonding them provisionally; inserting the second green sheet in the punched-out portion of the first green sheet to form a composite green sheet of different materials; peeling off the second green sheet provisionally bonded to the surface of the first green sheet; overlaying a plurality of composite green sheets of different materials and pressing them to mold a green sheet laminate; and firing the green sheet laminate. With these steps, electronic elements such as a capacitor and an inductor can be integrally formed in arbitrary portions of the respective laminated ceramic substrates and conductive lines for connecting the electronic elements in the direction of main surface of the ceramic substrate can be arranged without limitation. Hence, the method can enhance the degree of flexibility in circuit design, can facilitate designing a circuit of high packaging density, and hence can manufacture a compact substrate.

It is preferable that the method of manufacturing a multilayer ceramic substrate according to the invention further includes a step of bonding the composite green sheet of different materials to a support sheet having no punched hole after the step of peeling off the second green sheet provisionally bonded to a surface of the first green sheet. By bonding the composite green sheet of different materials to the support sheet having no punched hole, a via hole can formed in the green sheet and a conductive paste can be printed on the green sheet.

The method of manufacturing a multilayer ceramic substrate according to the invention further includes a step of forming a via hole in any one or both of the first green sheet and the second green sheet. As for the forming of the via hole in the first green sheet, the via hole may be formed in the first green sheet of the composite green sheet of different materials or may be formed in the first green sheet before the second green sheet is inserted in the first green sheet. As for the forming of the via hole in the second green sheet, the via hole may be formed in the second green sheet of the composite green sheet of different materials or may be formed in the second green sheet before the second green sheet is inserted in the first green sheet.

It is preferable that the method of manufacturing a multilayer ceramic substrate according to the invention further includes a step of printing a conductive paste on the composite green sheet of different materials. Here, it is more preferable that the conductive paste is printed across a boundary between the first green sheet and the second green sheet. Because the conductive paste is printed after the second green sheet is inserted in the predetermined portion of the first green sheet, the conductive paste can be also printed across the boundary between the first green sheet and the second green sheet, whereby the conductive layer can be designed with extreme flexibility. By printing the conductive paste across the boundary between the first green sheet and the second green sheet, the conductive paste can be electrically connected to the desired electronic elements of the ceramic substrate.

The method of manufacturing a multilayer ceramic substrate according to the invention includes a case where, when the green sheet laminate is formed, the punched portions of the first green sheets are mated with each other in such a way that the second green sheets have portions overlapping each other above and below in the direction of lamination, a conductive paste is printed on the surface of the second green sheet inserted in the punched portions, and an internal conductive layer is interposed between the second green sheets. With this method, a laminated capacitor element can be arranged in the multilayer ceramic substrate.

The method of manufacturing a multilayer ceramic substrate according to the invention includes a case where the first green sheet and the second green sheet are formed of materials whose dielectric constants are different from each other after firing. This is because a capacitor element and an inductor element are formed in the same ceramic substrate.

It is preferable in the method of manufacturing a multilayer ceramic substrate according to the invention that the first green sheet and the second green sheet are equal to each other in thickness. It is not necessary that the respective laminated ceramic substrates are equal to each other in thickness, but when the surface (interface) of each substrate is planarized, the occurrence of separation between the substrates can be further prevented.

It is preferable in the method of manufacturing a multilayer ceramic substrate according to the invention that the first green sheet and the second green sheet have the same level of pressing compressibility and the same level of firing shrinkage. This can prevent the occurrence of separation and cracks.

In the invention, the different dielectrics are electrically connected to each other in the direction of main surface of the sheet, so that the degree of flexibility in circuit design can be increased and the substrate itself can be made compact in size. Further, the dielectrics can be formed in necessary sizes only in necessary portions and the dielectrics to be combined can be selected comparatively freely without limitations of firing shrinkage and coefficient of thermal expansion. Still further, because the different dielectrics are inserted in predetermined portions with accuracy, the occurrence of separation and cracks can be also prevented.

DETAILED DESCRIPTION OF THE PREFERRED EMBODIMENTS

Embodiments of the invention will be shown below to describe the invention in detail, but it should not be understood that the invention is limited to these embodiments. Here, the same parts are denoted by the same reference symbols.

Figure 1:
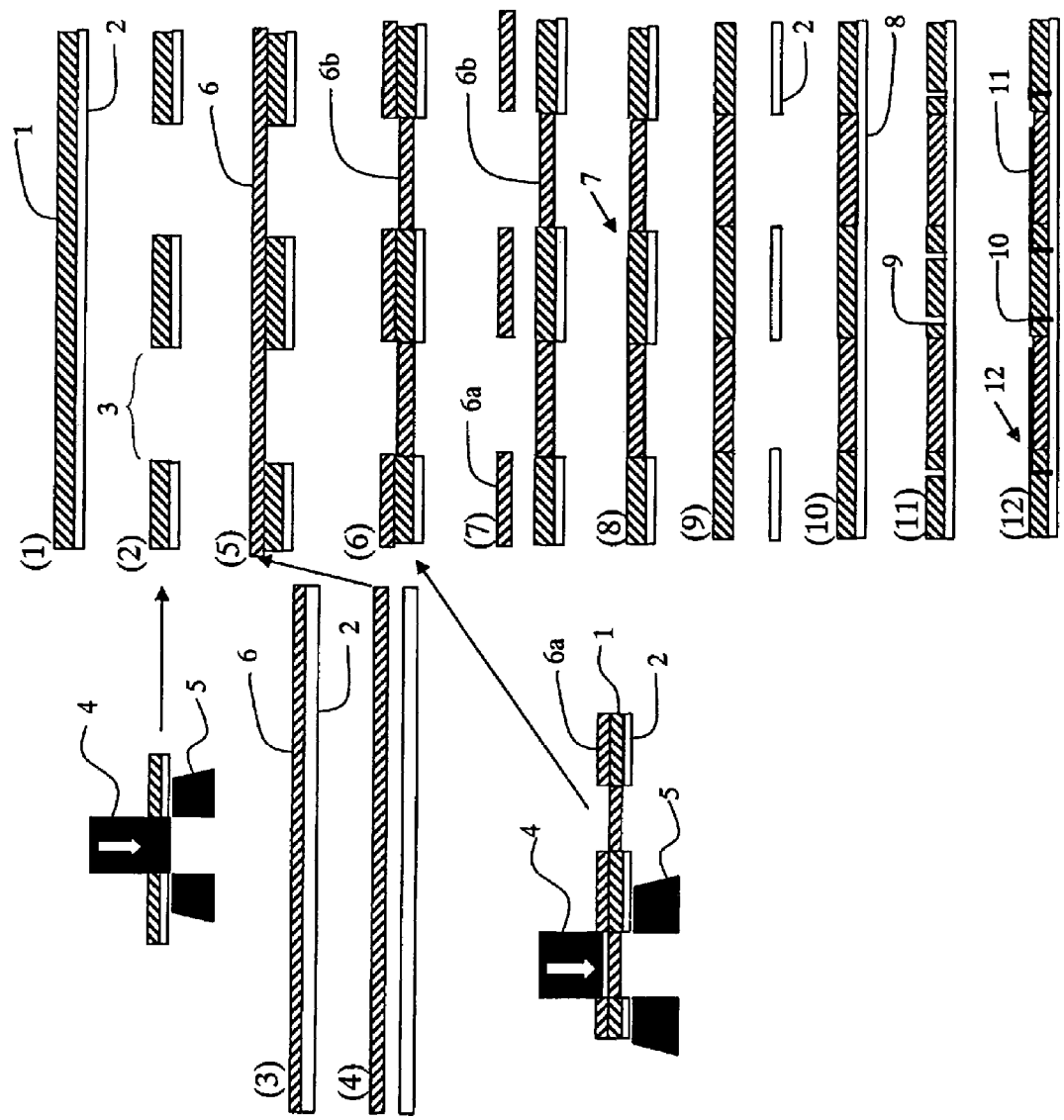
FIG. 1 shows schematic illustrations to show a process of manufacturing a composite green sheet of different materials used in an embodiment of the invention.

First, a method of manufacturing a multilayer ceramic substrate according to the embodiment will be described. In FIG. 1 are shown schematic illustrations to show a process of manufacturing a composite green sheet made of different materials used in this embodiment.

As shown in FIG. 1(1), a first green sheet 1 is formed on a support sheet 2 such as PET (polyethylene terephthalate) sheet. For example, ceramic powder is mixed with organic vehicle to make slurry as a dielectric paste and a film is formed of the slurry on a resin sheet such as a PET (polyethylene terephthalate) sheet by a doctor blade method or the like to produce a green sheet. To produce a glass ceramic substrate, slurry is used that is made by mixing ceramic powder and glass powder with organic vehicle. The organic vehicle is such that binder is dissolved in an organic solvent and is mainly constructed of: a solvent such as terpineol, butyl carbitol, acetone, toluene, and isopropyl alcohol; a binder such as ethyl cellulose and poly(vinyl butyral); and a plasticizer such as di-n-butylphthalate. In addition, deflocculant and humectant may be added thereto. The contents of the organic vehicle are not limited to specific values, but may be common contents, for example, 1 to 5 wt % binder and 10 to 50 wt % solvent.

In addition to the above-described organic paint containing organic vehicle, water-soluble paint made by dissolving a water-soluble binder and dispersant in water may be used. Here, the water-soluble binder is not limited to a specific material but can be selected as appropriate from poly(vinyl alcohol), cellulose, water-soluble acrylic resin, and emulsion.

Materials constructing main ingredients and secondary ingredients are used as the dielectric raw materials of the dielectric paste according to the composition of a dielectric porcelain composition. In this regard, the forms of raw materials are not limited to specific ones but oxides constructing the main ingredients and the secondary ingredients and/or compounds that become oxides when they are fired may be used. The raw materials may be powders produced by either a liquid-phase synthetic method or a solid-phase method. Here, compounds that become oxides when they are fired include, for example, carbonate, nitrate, oxalate, and organometallic compound. Needless to say, oxide and compound that becomes oxide when it is fired may be used in combination. It is recommended that the contents of respective compounds in the dielectric raw materials be determined so as to make the composition of the above-described dielectric porcelain composition after they are fired.

In the case of manufacturing a glass ceramic substrate that is an LTCC substrate, a glass component and a ceramic component can be selected as appropriate on the basis of a target dielectric constant and a firing temperature, and a substrate made of alumina (crystal phase), produced by firing at 1000° C. or less, and silicon oxide (glass phase) can be taken as an example. In addition, as the ceramic component can be used magnesia, spinel, silica, mullite, forsterite, steatite, cordierite, strontium feldspar, quartz, zinc silicate, zirconia, and titania or the like. As the glass component can be used borosilicate glass, borosilicate barium glass, borosilicate strontium glass, borosilicate zinc glass, borosilicate potassium glass or the like. Preferably, the content of the glass component is 60 to 80 volume % and the content of ceramic component that is aggregate is 40 to 20 volume %. This is because if the content of the glass component is outside the above range, a composite composition is hard to form and is decreased in strength and sintering property.

The thickness of each first green sheet is determined for usage of elements and conductive lines made in the substrate by firing and usually ranges from 20 to 245 μm. And the thickness of the sheet after firing becomes 13 to 160 μm. For example, in the case of usage in which many inductance elements need to be made, it is preferable that the thickness of the first green sheet is thin. To give an actual example, the thickness of the green sheet is 20 to 45 μm, and after firing, the thickness becomes 13 to 30 μm. Further, when a conductive lines of high Q value is formed or a via hole for radiating heat is formed, it is preferable that the thickness of the first green sheet is thick. To give an actual example, the thickness of the green sheet is 60 to 80 μm, and after firing, the thickness becomes 39 to 52 μm. The number of layers of the first green sheets is not limited to a specific number but ranges from 4 to 50.

Next, as shown in FIG. 1(2), the first green sheet 1 is punched out by a puncher 4 in a state where a predetermined portion 3 to be punched of the first green sheet 1 attached to the support sheet 2. The shape of the predetermined portion 3 to be punched is determined by the shape of a die 5.

Next, as shown in FIG. 1(3), a second green sheet 6 is formed on the support sheet 2 such as a PET sheet by the same method as used for the first green sheet. Here, the second green sheet 6 is preferably formed of a material whose dielectric constant becomes different after firing from the first green sheet 1. The dielectric constant of the second green sheet 6 is selected as appropriate according to the characteristics of a capacitor element and an inductance element that are to be formed. However, it is preferable that the first green sheet 1 and the second green sheet 6 are equal in thickness to each other so as to form a final flat composite green sheet 7 of different materials. Further, the composition of dielectric paste used for the first green sheet 1 and the second green sheet 6 are preferably prepared in such a way that the first green sheet 1 and the second green sheet 6 have press compressibility and firing shrinkage of the same level. A combination of material compositions to be described below is taken as an example of a combination of compositions to satisfy these characteristics.

For example, when the composition of the dielectric raw material of the first green sheet is aluminum oxide base dielectric raw material ($Al_2O_3$-glass ($SiO_2$—$B_2O_3$—$Al_2O_3$—MgO—CaO—SrO)), the composition of the dielectric raw material of the second green sheet is preferably the following composition. That is, aluminum oxide-titan oxide base dielectric raw material ($Al_2O_3$—$TiO_2$-glass ($SiO_2$—$B_2O_3$—$Al_2O_3$—MgO—CaO—SrO)), and aluminum oxide-titan oxide-strontium oxide base dielectric raw material ($SiO_2$—$Al_2O_3$—$La_2O_3$—$B_2O_3$—$TiO_2$—$Bi_2O_3$—$Nd_2O_3$—SrO)) can be preferably used.

Next, as shown in FIG. 1(4), the second green sheet 6 is separated from the support sheet 2.

Next, as shown in FIG. 1(5), the separated second green sheet 6 is placed on the punched first green sheet 1 and is provisionally bonded to it, preferably, by pressing. The conditions of provisional bonding are not limited to specific ones but, preferably, pressing pressure is 3 to 5 MPa, heating temperature is 35 to 80° C., and pressing time is 0.1 to 1.0 second.

Next, as shown in FIG. 1(6), the degree of inserting the puncher 4 into the die 5 is adjusted and the second green sheet 6 is punched out and the punched second green sheet 6b is inserted in the punched portion 3 of the first green sheet 1. By aligning the first green sheet 1, the second green sheet 6, the puncher 4, and the die 5 with each other, the punched second green sheet 6b can be inserted in the punched portion 3 of the first green sheet 1 with high accuracy.

Next, as shown in FIGS. 1(7) and 1(8), the second green sheet 6a after punching is peeled of f from the first green sheet 1. Further, as shown in FIG. 1(9), the support sheet 2 is peeled off from the composite green sheet 7 made of different materials. Accordingly, the composite green sheet 7 of different materials can be produced in which the punched second green sheet 6b is inserted in the punched portion 3 of the first green sheet 1.

In the green sheet used in this embodiment, for the purpose of printing a conductive paste, it is preferable that after the step of peeling off the second green sheet 6a provisionally bonded to the surface of the first green sheet 1, a support sheet 8 having no punching hole is bonded to the green sheet. That is, as shown FIG. 1(10), the support sheet 8 such as a new PET sheet having no hole is prepared and is bonded, preferably by pressing, to the composite green sheet 7 of different materials. The conditions of bonding by pressing are not limited to specific ones but preferably, pressing pressure is 5 to 8 MPa, heating temperature is 50 to 100° C., and pressing time is 3.0 to 8.0 seconds.

As shown in FIG. 1(11), it is also recommended that a step of forming via holes 9 in any one or both of the first green sheet and the second green sheet of the composite green sheet 7 of different materials, bonded to the support sheet 8, is performed before printing the conductive paste. In this regard, the forming of the via holes 9 in the first green sheet is performed not only after the composite green sheet 7 of different materials is formed but also, for example, after the first green sheet 1 is formed (after FIG. 1(1) or 1(2)). The forming of the via holes 9 in the second green sheet 6 is performed not only after the composite green sheet 7 of different materials is formed but also, for example, after the second green sheet 6 is formed (after FIG. 1(3)).

Next, as shown in FIG. 1(12), the conductive paste is printed on the surface of the composite green sheet 7 of different materials and in the via holes 9 to form a conductive layer 11 and via holes 10. Because the conductive paste is printed after the composite green sheet 7 of different materials is formed, the conductive paste can be printed on both of the first green sheet 1 and the second green sheet 6b inserted in the first green sheet 1. In addition, the conductive paste can be printed across the boundary between the first green sheet 1 and the second green sheet 6b. Therefore, a pattern of circuits and electrodes can be freely printed irrespective of the positions where the second green sheet 6b is inserted in the composite green sheet 7 of different materials.

The conductive paste is prepared by kneading conductive material of various kinds of conductive metals and alloy such as Ag, Ag—Pd alloy, Cu, and Ni with the above-described organic vehicle. The contents of the organic vehicle are not limited to specific values but usual contents can be used: for example, binder is 1 to 5 wt % and solvent is 10 to 50 wt %. Further, additives selected from various kinds of dispersants and plasticizers may be contained in the respective pastes when necessary.

Thereafter, the support sheet 8 is peeled off from the composite green sheet 7 of different materials (not shown).

By the above process, the composite green sheet of different materials can be formed. Next, a plurality of composite green sheets of different materials are laminated and are pressed on a full-scale basis in the direction of lamination to form a green sheet laminate. The pressure of full-scale pressing is not limited to a specific one but preferably ranges from 40 to 100 MPa and a heating temperature ranges from 35 to 80° C.

Figure 2:
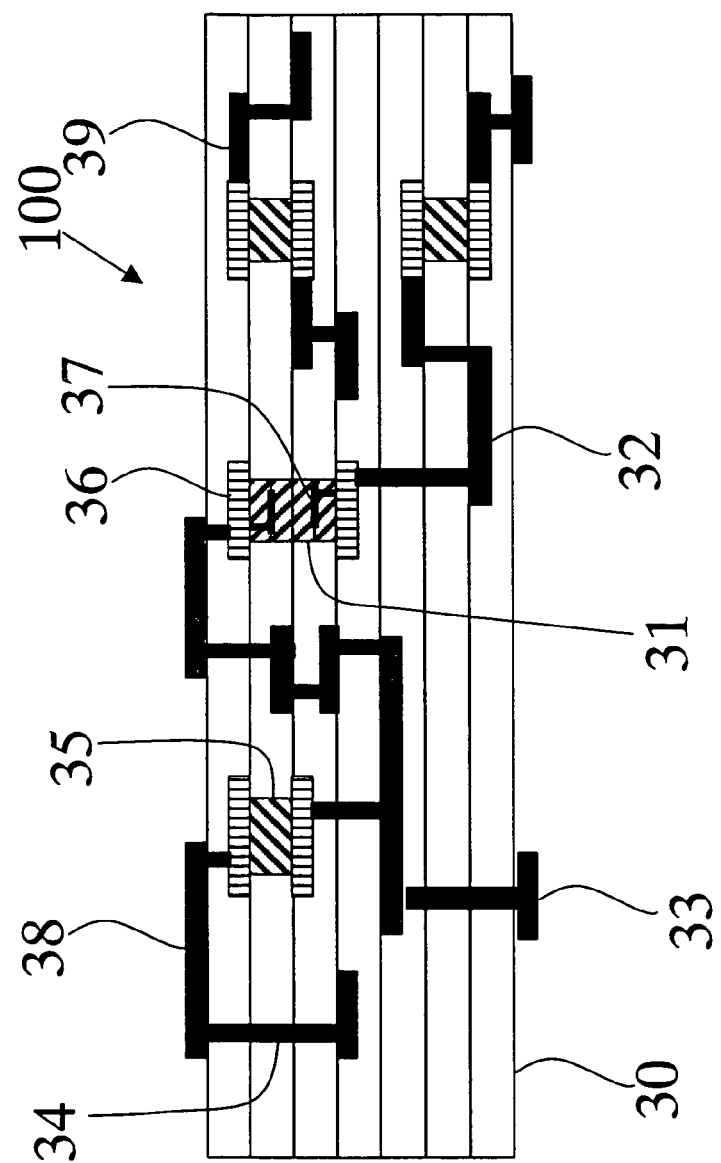
FIG. 2 is a schematic sectional view showing one mode of a multilayer ceramic substrate according to the embodiment.

Thereafter, the green sheet laminate is subjected to a binder burn-out processing and a firing processing to produce a multilayer ceramic substrate 1 after firing, as shown in FIG. 2. FIG. 2 is a schematic sectional view showing one embodiment of a multilayer ceramic substrate according to this embodiment.

A firing temperature is determined according to the material of the green sheet and is not limited to a specific temperature but usually ranges from 850 to 1000° C. A firing atmosphere can be determined as appropriate according to the kinds of conductive materials in the conductive paste. When base metal such as Cu, Ni, Cu alloy, and Ni alloy is used as the conductive material, the firing atmosphere is preferably made a reducing atmosphere and the partial pressure of oxygen of the firing atmosphere is preferably made $10^{-10}$ to $11^{-3}$ Pa, more preferably $10^{-7}$ to $11^{-3}$ Pa. If the partial pressure of oxygen at the time of firing is too low, the conductive material in an internal electrode tends to cause abnormal sintering and to break off. If the partial pressure of oxygen at the time of firing is too high, the internal electrode tends to be oxidized.

Thereafter, a circuit pattern 38 and terminals 33 are printed on the surface of the multilayer ceramic substrate 100. Here, the circuit pattern may be printed before the multilayer ceramic substrate 100 is fired.

In the multilayer ceramic substrate 100, dielectric layers 31 and other dielectric layers 35 different from the dielectric layers 31 can be formed at desired positions and in desired sizes, and is it possible to easily form electric connections 39 to the direction of main surface of each ceramic substrate. Further, conductive through holes 34 can be also formed with ease in a conventional manner.

In this regard, when a laminate type capacitor is formed in the multilayer ceramic substrate, the following process is performed. That is, when the green sheet laminate is formed, the punched portions of the first green sheets are aligned with each other in such away that the second green sheets have portions overlapping above and below in the direction of lamination. The conductive paste is printed on the surface of the second green sheet inserted in this punched portions. With this, an internal conductive layer is interposed between the layers of the second green sheets when the multilayer ceramic substrate is formed, whereby laminate type capacitors can be formed. In this regard, a conductive layer and an electrode pattern can be freely printed irrespective of the positions where the second green sheet is inserted in the composite green sheet 7 of different materials, so that the internal electrode layers can be electrically connected to each other with ease.

The invention is not limited to the embodiment described above but can be variously modified within the scope of the invention.

For example, the embodiment described above has described the case where the second green sheet is equal in thickness to the first green sheet. However, as shown in FIG. 2, it is also recommendable to overlay two second green sheets, the thickness of which is made one half of the thickness of the first green sheet, and to form an internal conductive layer 37 between two overlaid second green sheets.

EXAMPLES

Example 1

Figure 3:
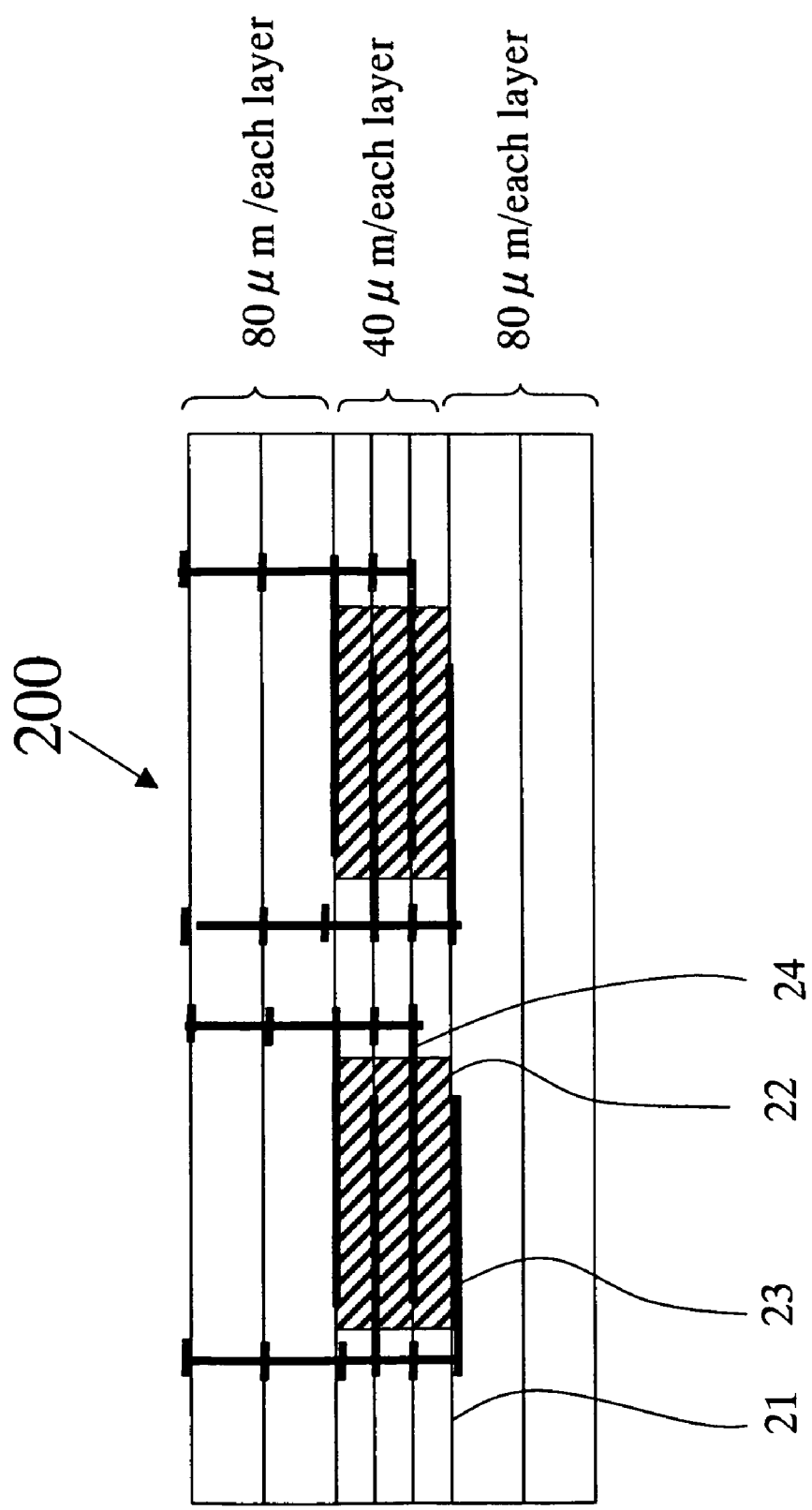
FIG. 3 is a schematic sectional view showing one example of a multilayer ceramic substrate formed in the embodiment.

A multilayer ceramic substrate having a capacitor element shown in FIG. 3 was formed, and capacitance and IR were measured. A fired layer 21 of the first green sheet was made to have a composition ($SiO_2$—$B_2O_3$—$Al_2O_3$—MgO—CaO—SrO) whose dielectric constant $\epsilon$ was 7.3 after firing. A fired layer 22 of the second green sheet was made to have a composition ($SiO_2$—$Al_2O_3$—$La_2O_3$—$B_2O_3$—BaO—$TiO_2$—$Bi_2O_3$—$Nd_2O_3$—SrO) whose dielectric constant e was 21.1 after firing. The size after firing of the second green sheet inserted in the first green sheet was made 2.57 mm×2.57 mm×40 µm. The size of an internal electrode was 2.13 mm×2.13 mm. An external electrode is denoted by a reference numeral 23. This was Example 1.

Example 2

Similarly, the fired layer 21 of the first green sheet was made to have a composition (BaO—$Al_2O_3$—$SiO_2$—$B_2O_3$) whose dielectric constant $\epsilon$ was 5.9 after firing. The fired layer 22 of the second green sheet was made to have a composition (BaO—$Nd_2O_3$—$TiO_2$—$B_2O_3$—CaO—ZnO) whose dielectric constant $\epsilon$ was 72.3 after firing. The size after firing of the second green sheet 22 inserted in the first green sheet 21 was made 2.57 mm×2.57 mm×40 µm. The size of the internal electrode was made 1.71 mm×1.71 mm. This was Example 2.

Figure 4:
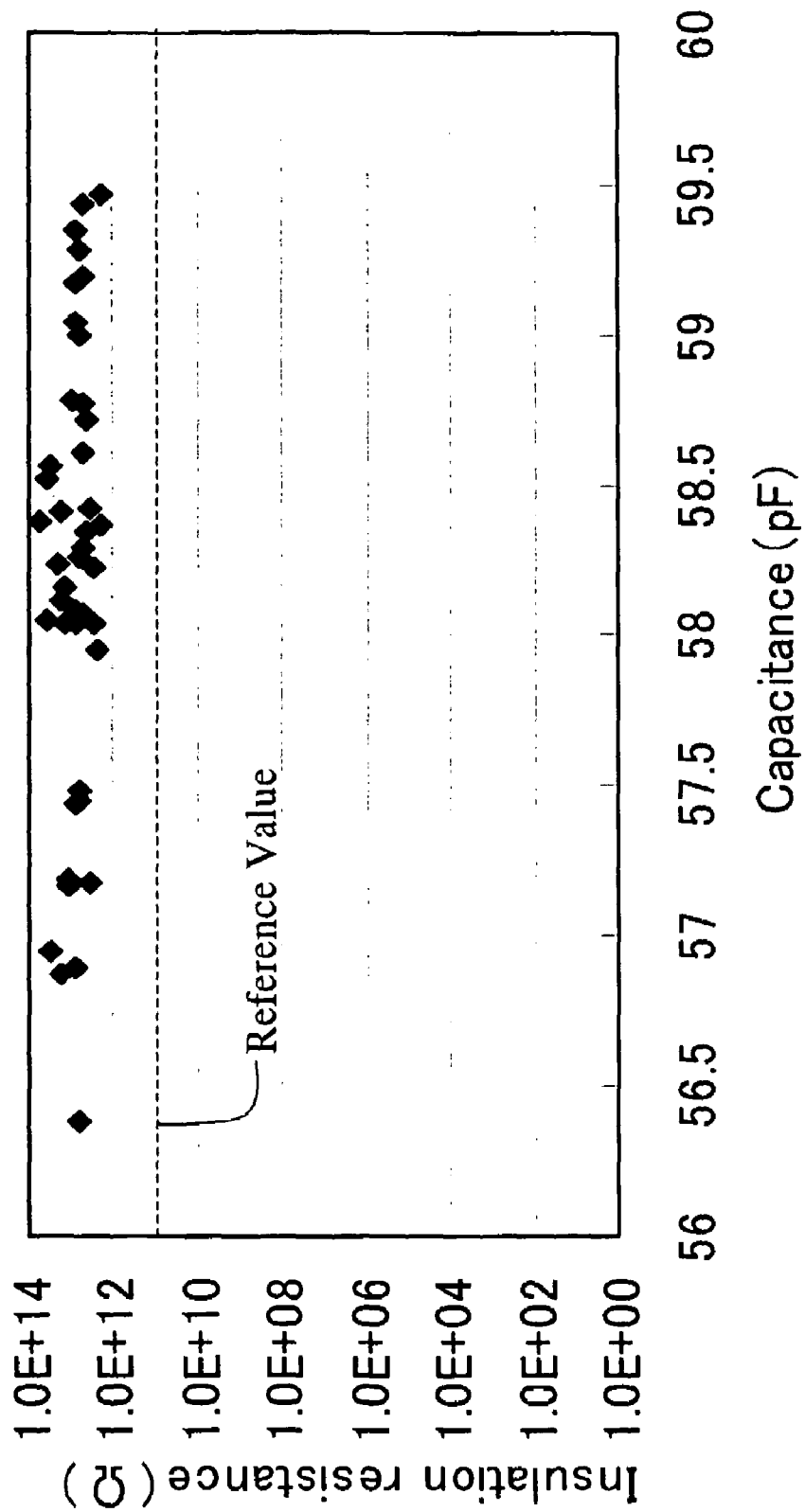
FIG. 4 shows the relationship between capacitor capacity and insulation resistance of Example 1, measured under conditions that a frequency for capacity measurement is 1 kHz and a voltage for IR measurement is 10 V.
Figure 5:
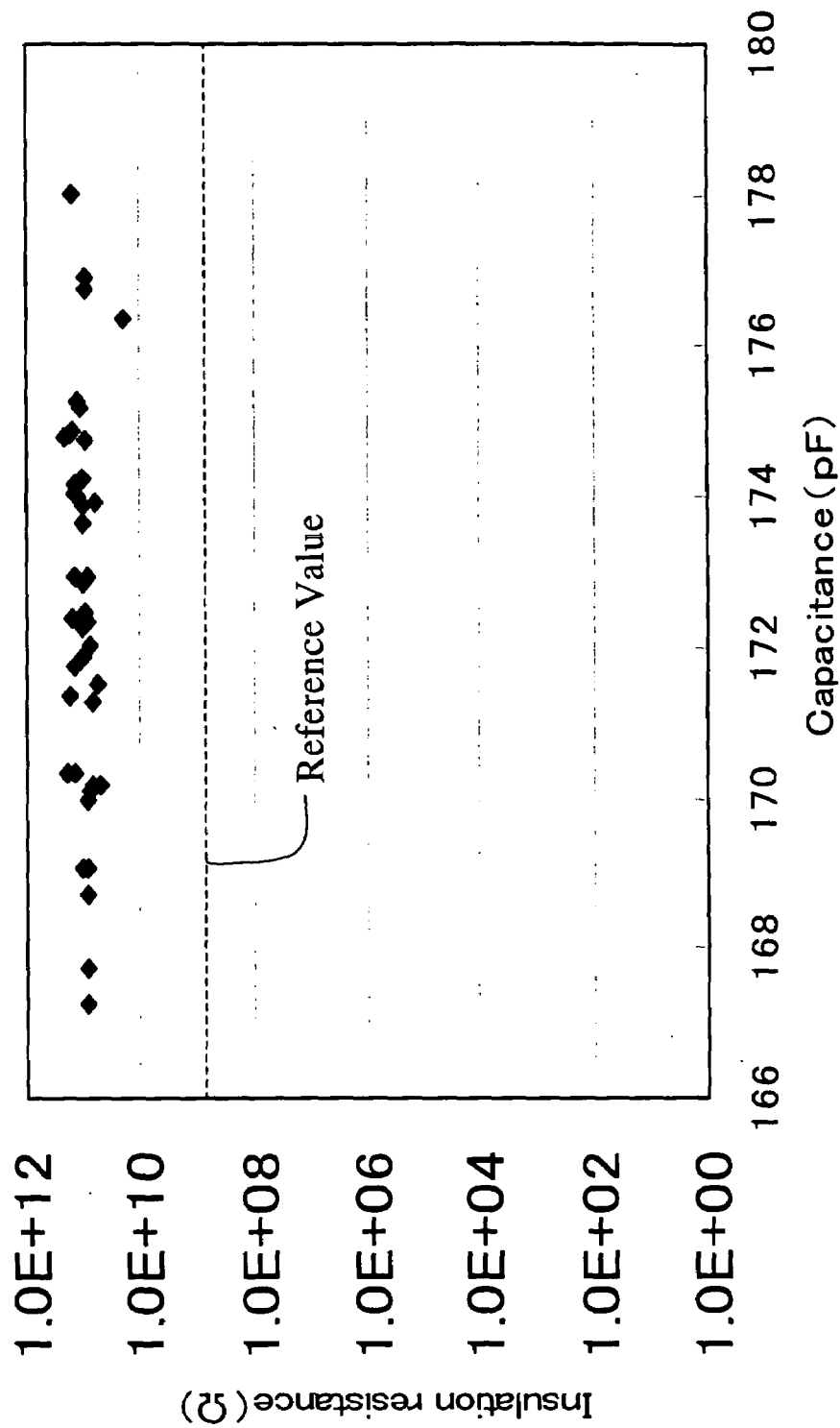
FIG. 5 is shows the relationship between capacitor capacity and insulation resistance of Example 2, measured under conditions that a frequency for capacity measurement is 1 kHz and a voltage for IR measurement is 10 V.

The relationship between capacitor capacity and insulation resistance of Example 1, which was measured under conditions that a frequency for capacity measurement was 1 kHz and a voltage for IR measurement was 10 V, is shown in FIG. 4. The relationship between capacitor capacity and insulation resistance of Example 2, which was measured under conditions that a frequency for capacity measurement was 1 kHz and a voltage for IR measurement was 10 V, is shown in FIG. 5. Referring to FIGS. 4 and 5, in the case of FIG. 4, there is provided insulation resistance equal to or larger than $10^{11}$ Ω, and in the case of FIG. 5, there is provided insulation resistance equal to or larger than $10^9$ Ω. Therefore, the multilayer ceramic substrate had characteristics higher than a predetermined quality level.

What is claimed is:

1. A production method of a multilayer ceramic substrate, comprising the steps of:
   punching out a predetermined portion of a first green sheet attached to a support sheet;
   overlaying a second green sheet peeled off from the support sheet on the first green sheet attached to the support sheet and bonding them provisionally;
   inserting the second green sheet in the punched-out portion of the first green sheet attached to the support sheet to form a composite green sheet of different materials;
   peeling off the second green sheet provisionally bonded to a surface of the first green sheet attached to the support sheet;
   peeling off the support sheet from the first green sheet;
   overlaying a plurality of composite green sheets of different materials and pressing them to mold a green sheet laminate; and
   firing the green sheet laminate.

2. The production method of a multilayer ceramic substrate according to claim 1, further comprising a step of bonding the composite green sheet of different materials to a second support sheet having no punched hole after the step of peeling off the second green sheet provisionally bonded to a surface of the first green sheet.

3. The production method of a multilayer ceramic substrate according to claim 1, further comprising a step of forming a via hole in any one or both of the first green sheet and the second green sheet.

4. The production method of a multilayer ceramic substrate according to claim 1, wherein, when the green sheet laminate is formed, the punched portions of the first green sheets are mated with each other in such a way that the second green sheets have portions overlapping each other above and below in a direction of lamination, a conductive paste is printed on a surface of the second green sheets inserted in the punched portions, and an internal conductive layer is interposed between the second green sheets.

5. The production method of a multilayer ceramic substrate according to claim 1, wherein the first green sheet and the second green sheet are formed of materials whose dielectric constants are different from each other after firing.

6. The production method of a multilayer ceramic substrate according to claim 1, wherein the first green sheet and the second green sheet are equal in thickness to each other.

7. The production method of a multilayer ceramic substrate according to claim 1, wherein the first green sheet and the second green sheet have the same level of pressing compressibility and the same level of firing shrinkage.

8. The production method of a multilayer ceramic substrate according to any one of claims 1 to 3, further comprising a step of printing a conductive paste on the composite green sheet of different materials.

9. The production method of a multilayer ceramic substrate according to claim 8, wherein, in the step of printing a conductive paste on the composite green sheet of different materials, the conductive paste is printed across a boundary between the first green sheet and the second green sheet.

\* \* \* \* \*